United States Patent
Chuang et al.

(10) Patent No.: US 7,071,106 B2
(45) Date of Patent: Jul. 4, 2006

(54) METHOD FOR CMP REMOVAL RATE COMPENSATION

(75) Inventors: Yen Chuang, Taipei (TW); Vincent Chen, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 262 days.

(21) Appl. No.: 10/731,261

(22) Filed: Dec. 5, 2003

(65) Prior Publication Data

US 2005/0124165 A1 Jun. 9, 2005

(51) Int. Cl.
*H01L 21/461* (2006.01)
*H01L 21/302* (2006.01)

(52) U.S. Cl. ............... 438/690; 438/692; 438/693

(58) Field of Classification Search ............... None
See application file for complete search history.

(56) References Cited

U.S. PATENT DOCUMENTS

| | | | | |
|---|---|---|---|---|
| 6,083,840 A | * | 7/2000 | Mravic et al. | 438/693 |
| 6,848,970 B1 | * | 2/2005 | Manens et al. | 451/5 |
| 2002/0068450 A1 | * | 6/2002 | Halley | 438/690 |
| 2003/0190864 A1 | * | 10/2003 | Lehman et al. | 451/5 |
| 2004/0192049 A1 | * | 9/2004 | Ohno et al. | 438/693 |

* cited by examiner

*Primary Examiner*—Duy-Vu N. Deo
(74) *Attorney, Agent, or Firm*—Tung & Assoc.

(57) ABSTRACT

A method for polishing a material layer on a semiconductor wafer to a desired target layer thickness. The method includes calculating a compensated removal rate based on the thickness of material to be removed from a material layer on the wafer according to a standard value; the current material removal rate of the CMP apparatus; and the offset thickness, which equals the difference between the thickness of the material layer which would be attained using the current material removal rate and the target thickness for the material layer. The calculated compensated removal rate is then programmed into the controller for the CMP apparatus, which polishes the material layer at the calculated compensated removal rate to achieve the desired target layer thickness for the layer.

20 Claims, 2 Drawing Sheets

METHOD FOR CMP REMOVAL RATE COMPENSATION

FIELD OF THE INVENTION

The present invention relates to apparatus and methods for the polishing of semiconductor wafer substrates in the fabrication of semiconductor integrated circuits. More particularly, the present invention relates to a new and improved method which is used to compensate for overpolishing and underpolishing of wafers to enhance precision in chemical mechanical polishing operations.

BACKGROUND OF THE INVENTION

Apparatus for polishing thin, flat semiconductor wafers are well-known in the art. Such apparatus normally includes a polishing head which carries a membrane for engaging and forcing a semiconductor wafer against a wetted polishing surface, such as a polishing pad. Either the pad or the polishing head is rotated and oscillates the wafer over the polishing surface. The polishing head is forced downwardly onto the polishing surface by a pressurized air system or similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head, a wafer unload station, or a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in deionized water.

CMP polishing results from a combination of chemical and mechanical effects. A possible mechanism for the CMP process involves the formation of a chemically altered layer at the surface of the material being polished. The layer is mechanically removed from the underlying bulk material. An altered layer is then regrown on the surface while the process is repeated again. For instance, in metal polishing, a metal oxide may be formed and removed separately.

A polishing pad is typically constructed in two layers overlying a platen with the resilient layer as the outer layer of the pad. The layers are typically made of polyurethane and may include a filler for controlling the dimensional stability of the layers. The polishing pad is usually several times the diameter of a wafer and the wafer is kept off-center on the pad to prevent polishing a non-planar surface onto the wafer. The wafer is also rotated to prevent polishing a taper into the wafer. Although the axis of rotation of the wafer and the axis of rotation of the pad are not collinear, the axes must be parallel.

In a CMP head, large variations in the removal rate, or polishing rate, across the whole wafer area are frequently observed. A thickness variation across the wafer is therefore produced as a major cause for wafer non-uniformity. In the improved CMP head design, even though a pneumatic system for forcing the wafer surface onto a polishing pad is used, the system cannot selectively apply different pressures at different locations on the surface of the wafer. The thickness difference between the highest point and the lowest point on the wafer is almost 2,000 angstroms, resulting in a standard deviation of 472 angstroms, or 6.26%. The removal rates obtained at the edge portions of the wafer are substantially higher than the removal rates at or near the center of the wafer. The thickness uniformity on the resulting wafer after the CMP process is poor.

Referring to FIG. 1A, a conventional CMP apparatus 50 includes a conditioning head 52, a polishing pad 56, and a slurry delivery arm 54 positioned over the polishing pad 56. The conditioning head 52 includes a conditioning disk 68 which is mounted on a conditioning arm 58 which is extended over the top of the polishing pad 56 for making a sweeping motion across the entire surface of the polishing pad 56. The slurry delivery arm 54 is equipped with slurry dispensing nozzles 62 which are used for dispensing a slurry solution on the top surface 60 of the polishing pad 56. Surface grooves 64 are further provided in the top surface 60 to facilitate even distribution of the slurry solution and to help entrapping undesirable particles that are generated by coagulated slurry solution or any other foreign particles which have fallen on top of the polishing pad 56 during a polishing process. The surface grooves 64, while serving an important function of distributing the slurry, also presents a processing problem when the pad surface 60 gradually wears out after prolonged use.

The conventional conditioning disk 68 may be of several different types. A conventional brazed grid-type conditioning disk is formed by embedding or encapsulating diamond particles in random spacings with each other in the surface of a stainless steel substrate. A conventional dia grid-type conditioning disk is formed by embedding cut diamonds at regular spacings in a nickel film coated onto the surface of a stainless steel substrate. The diamonds are typically coated with a diamond-like carbon (DLC) layer.

The CMP apparatus 50 typically further includes a polishing head 70 which is mounted on a rotatable shaft 72 above the top surface 60 of the polishing pad 56. As shown in FIG. 1B, the polishing head 70 holds and rotates a wafer 74 against the top surface 60 of the polishing pad 56 to polish the wafer 74. Before production wafers are polished using the CMP apparatus 50, time is typically allotted to warm the polishing pad 56 and facilitate flow of polishing slurry from a slurry container (not shown) to the slurry delivery arm 54. This enhances polishing uniformity among successive wafers polished on the apparatus 50.

The polishing pad 56 is a consumable item used in a semiconductor wafer fabrication process. Under normal wafer fabrication conditions, the polishing pad 56 is replaced after about 12 hours of usage. Polishing pads may be hard, incompressible pads or soft pads. For oxide polishing, hard and stiffer pads are generally used to achieve planarity. Softer pads are generally used in other polishing processes to achieve improved uniformity and smooth surfaces. The hard pads and the soft pads may also be combined in an arrangement of stacked pads for customized applications.

A problem frequently encountered in the use of polishing pads in oxide planarization is the rapid deterioration in oxide polishing rates with successive wafers. The cause for the deterioration is known as "pad glazing", wherein the surface of a polishing pad becomes smooth such that slurry is no longer held in between the fibers of the pad. This physical phenomenon on the pad surface is not caused by any chemical reations between the pad and the slurry.

To remedy the pad glazing effect, numerous techniques of pad conditioning or scrubbing have been proposed to regenerate and restore the pad surface and thereby restore the polishing rates of the pad. The pad conditioning techniques include the use of silicon carbide particles, diamond emery paper, blade or knife for scraping or scoring the polishing pad surface. The goal of the conditioning process is to remove polishing debris from the pad surface and re-open pores in the pad by forming micro-scratches in the surface of the pad for improved pad lifetime. The pad conditioning process can be carried out either during a polishing process, i.e. known as concurrent conditioning, or after a polishing process. While the pad conditioning process improves the consistency and lifetime of a polishing pad, a conventional conditioning disk is frequently not effective in conditioning a pad surface after repeated usage.

Prior to the CMP operation, each wafer is typically subjected to a CVD (chemical vapor deposition) or other process to sequentially deposit material layers thereon. These layers include conductive layers, insulative layers, via layers and IMD (intermetal dielectric) layers, for example. The subsequent CMP operation polishes each layer to the desired thickness for precise dimensional control of the device components to be fabricated in the layers. However, in a modern semiconductor fabrication facility, wafers in different lots are frequently processed in different CVD chambers, which vary among each other in the thickness of a given layer that is deposited on a wafer.

The CMP apparatus carries out polishing operations on each wafer according to a recipe which is programmed into the controller (not shown) for the CMP apparatus. Because the layers on each wafer must typically be polished to different thicknesses, each layer on the wafer has its own polishing recipe. The polishing recipe includes such variables as down pressure and polish time. However, due to variations in layer thicknesses between wafer lots processed in different CVD chambers, the CMP apparatus, operating according to a given polishing recipe for each layer, has a tendency to overpolish some layers and underpolish other layers in a wafer, resulting in layers of imprecise thickness on the wafer. For this reason, for a given layer on each wafer of a given lot of wafers, each polishing recipe is programmed with a compensated removal rate to compensate for this polishing imprecision and facilitate polishing of each layer to a thickness which is as precise as possible.

The conventional polishing compensation process described above usually involves the use of a computer server and supporting software that includes first and second tables to aid personnel in the selection of the correct polishing recipe having the appropriate compensated removal rate for each of the layers on each wafer in a lot. The first table includes a sequential listing of the various lots of wafers, each of which is paired with the various layers to be polished on each wafer. An example of such a table is shown below as Table I.

TABLE I

| Product ID (lot) | Layer |
|---|---|
| TMA001 | VIA1 CMP |
| TMA001 | VIA2 CMP |
| TMA001 | VIA3 CMP |
| TMA001 | VIA4 CMP |
| TMA002 | VIA1 CMP |
| TMA002 | VIA2 CMP |
| TMA002 | VIA3 CMP |
| TMA002 | VIA4 CMP |

The second table displayed on the server includes a sequential listing of high and low limits for the thickness of each layer in Table I to be polished, paired with the appropriate polishing recipe to obtain a target layer thickness that lies within the desired range. An example of such a table is shown below as Table II.

TABLE II

| Lower THK limit | Higher THK limit | Recipe |
|---|---|---|
| 22,000 | 22,200 | IMD84.CAS |
| 22,200 | 22,400 | IMD86.CAS |
| 22,400 | 22,600 | IMD88.CAS |
| 22,600 | 22,800 | IMD9.CAS |
| 22,800 | 23,000 | IMD92.CAS |
| 23,000 | 23,200 | IMD94.CAS |
| 23,200 | 23,400 | IMD96.CAS |
| 23,400 | 23,600 | IMD98.CAS |

One of the problems which is inherent in the conventional, table-based method of compensating for CMP polishing imprecision is that, in attempts to achieve a layer thickness which is as close as possible to the target layer thickness, the method is capable of corrective over-polishing or under-polishing only by increments. As can be seen from Table II, each layer on a wafer can be over-polished or under-polished typically by 200 angstroms to achieve a layer thickness which is as close as possible to the target layer thickness for the layer. As an example, a normal polishing recipe for a given layer on a wafer may result in a layer which is 110 angstroms thicker than the target layer thickness. Using the compensation removal rate, the recipe, therefore, operates the CMP apparatus to overpolish the layer and remove an additional 200 angstroms from the wafer. The result is a layer which is 90 angstroms (200–110) thinner than the target layer thickness.

As another example, a normal polishing recipe for a given layer on a wafer may result in a layer which is 280 angstroms thinner than the target layer thickness. Using the compensation removal rate, the compensation recipe operates the CMP apparatus to underpolish the layer to leave an additional 200 angstroms on the wafer. The result is a layer which is 80 angstroms (280–200) thicker than the target layer thickness.

Another problem inherent in the conventional method is that the software required for the program occupies an inordinately large space on the server's hard drive. Accordingly, a new and improved method is needed to compensate for imprecisions in the CMP polishing of wafers.

It is an object of the present invention is to provide a new and improved method to compensate for variations in the removal of material from material layers on a wafer during CMP.

Another object of the present invention is to provide a new and improved method for achieving precision in the thickness of layers on a wafer using a CMP operation.

Still another object of the present invention is to provide a new and improved method for calculating a compensated removal rate for the removal of material from a layer on a wafer.

Yet another object of the present invention is to provide a method for achieving precise thickness of a material layer on a wafer during CMP.

A still further object of the present invention is to provide a method which can be used to remove material of any needed thickness over a continuum of thicknesses from a layer on a wafer to compensate for over-polishing or under-polishing of the wafer on a CMP apparatus.

Another object of the present invention is to provide a method for CMP removal rate compensation which requires a relatively low quantity of space on a server and is easy to use and maintain.

SUMMARY OF THE INVENTION

In accordance with these and other objects and advantages, the present invention is generally directed to a new and improved method for polishing a material layer on a semiconductor wafer to a desired target layer thickness. The method includes calculating a compensated removal rate based on the thickness of material to be removed from a material layer on the wafer according to a standard value; the current material removal rate of the CMP apparatus; and the offset thickness, which equals the difference between the thickness of the material layer which would be attained using the current material removal rate and the target thickness for the material layer. The calculated compensated removal rate is then programmed into the controller for the CMP apparatus, which polishes the material layer at the calculated compensated removal rate to achieve the desired target layer thickness for the layer.

In a most preferred embodiment of the invention, the method includes calculating a compensated removal rate according to the following formula:

Compensated RR=(non-compensated thickness/non-compensated thickness+offset thickness)*current removal rate where the "non-compensated thickness" is the thickness of material to be removed from a material layer on the wafer according to a standard value; the "offset thickness" is the difference between a prescribed thickness of the material layer which would be attained using the current material removal rate and a target thickness for the material layer; and "current removal rate" is the current material removal rate of the CMP apparatus.

BRIEF DESCRIPTION OF THE DRAWINGS

The invention will now be described, by way of example, with reference to the accompanying drawings, in which.

DESCRIPTION OF THE PREFERRED EMBODIMENTS

The present invention is generally directed to a new and improved method for polishing a material layer on a semiconductor wafer to a desired target layer thickness. The method includes calculating a compensated removal rate for a particular material layer to be polished or thinned on a wafer using a CMP process. The method compensates the CMP polishing recipe to account for variations in the thickness of a given material layer deposited on wafers by different CVD or other processing chambers to obtain the desired target layer thickness of the material layer on each wafer and thereby exert enhanced dimensional control of devices fabricated on the wafers. Briefly, the method includes calculating a compensated removal rate using a mathematical equation having variables for the non-compensated thickness of material to be removed from the material layer on the wafer according to a standard value; the current material removal rate of the CMP apparatus; and the offset thickness, or the difference between the thickness of the material layer which would be attained using the current material removal rate of the CMP apparatus and the target thickness for the material layer. The calculated compensated removal rate is programmed into the CMP apparatus controller and the apparatus polishes the material layer at the calculated compensated removal rate to attain the desired target layer thickness for the layer.

Figure 1A:
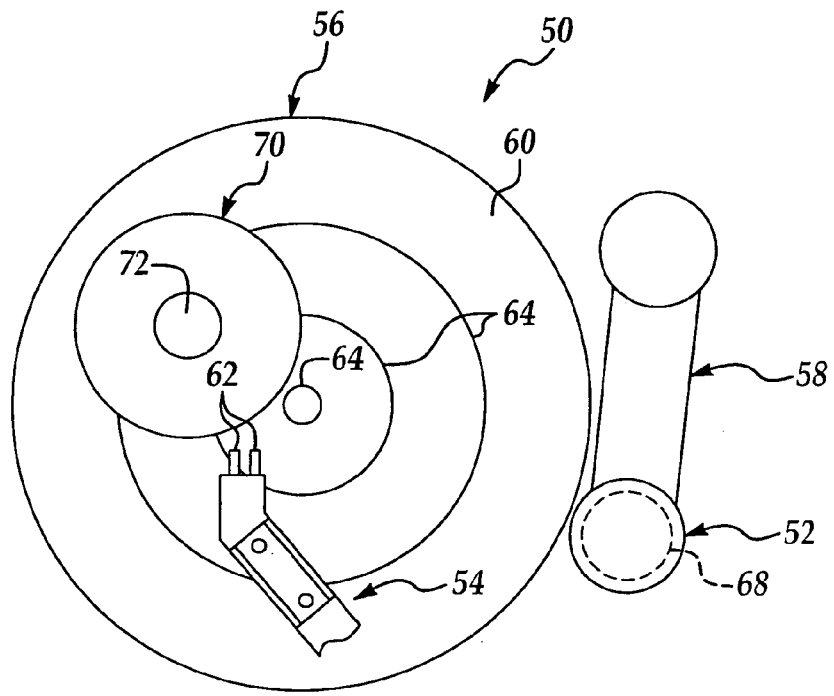
FIG. 1A is a top view of a typical conventional CMP apparatus for the chemical mechanical polishing of semiconductor wafer substrates.
Figure 1B:
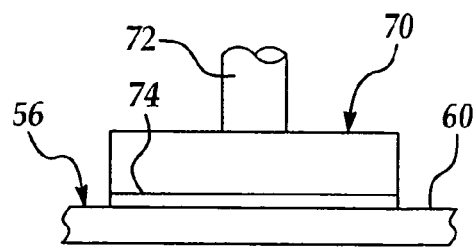
FIG. 1B is a side view of a polishing head on the conventional CMP apparatus of FIG. 1A, with a wafer (in section) interposed between the polishing head and a polishing pad in a CMP operation.
Figure 2:
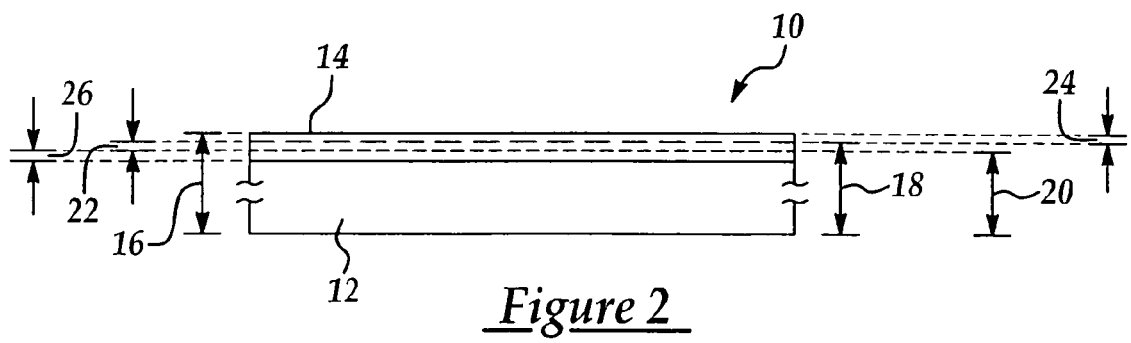
FIG. 2 is a cross-sectional view of a wafer having a material layer to be polished according to the method of the present invention.

Referring initially to FIG. 2, a wafer 10 according to the method of the present invention includes a typically silicon substrate 12. A material layer 14 is deposited on the substrate 12 typically using a chemical vapor deposition (CVD) process, which may be conventional. The material layer 14 may be a conductive layer or an insulative layer such as a via layer for the formation of vias therethrough or an intermetal dielectric (IMD), for example. After it is removed from the CVD or other process chamber (not shown) in which the material layer 14 is deposited on the substrate 12, the wafer 10, which includes the material layer 14 and the underlying substrate 12, as well as any additional material layers (not shown) between the substrate 12 and the material layer 14, has a total wafer thickness 16. Before fabrication of devices on the wafer 10 can resume, the material layer 14 must be thinned or polished using a CMP apparatus until the wafer 10 has a target wafer thickness 20. At the target wafer thickness 20, the material layer 14 has a target layer thickness 26 which is optimal for fabrication of device features in the layer 14.

The polishing rate of the non-compensated polishing recipe for the CMP apparatus to be used in polishing of the material layer 14 is normally determined using a standard value for the total wafer thickness which may roughly approximate the total wafer thickness 16 of any given wafer 10. In the event that all wafers 10 had a total wafer thickness 16 equal to the standard value, the non-compensated polishing recipe would result in each of the wafers 10 having the target layer thickness 26 and target wafer thickness 20. In actual practice, however, due to a variety of factors, the total wafer thickness 16 varies somewhat between wafers 10 processed in different CVD or other process chambers, and thus, from that standard value for the total wafer thickness. All wafers 10 in the same lot are processed in the same process chamber and therefore have substantially the same total wafer thickness 16. Therefore, a prescribed wafer thickness 18 is based on the standard value for the total thickness of each wafer 10 and is the thickness of the wafer 10 which would be obtained using the non-compensated polishing recipe for the material layer 14 on the actual, non-standard wafers 10. Use of the non-compensated polishing recipe for the layer 14 would result in removal of a non-compensated thickness 24 from the material layer 14, to obtain the prescribed wafer thickness 18 of each of the wafers 10 in the same lot. The prescribed wafer thickness 18 is frequently greater than the target wafer thickness 20, as shown in FIG. 2. Alternatively, the prescribed wafer thickness 18 may be less than the target wafer thickness 20. The difference between the prescribed wafer thickness 18 and the target wafer thickness 20 is the offset thickness 22. The total wafer thickness 16 ranges from typically about 20,000 to about 26,000 depending on the number and thickness of the material layers thereon.

Figure 3:
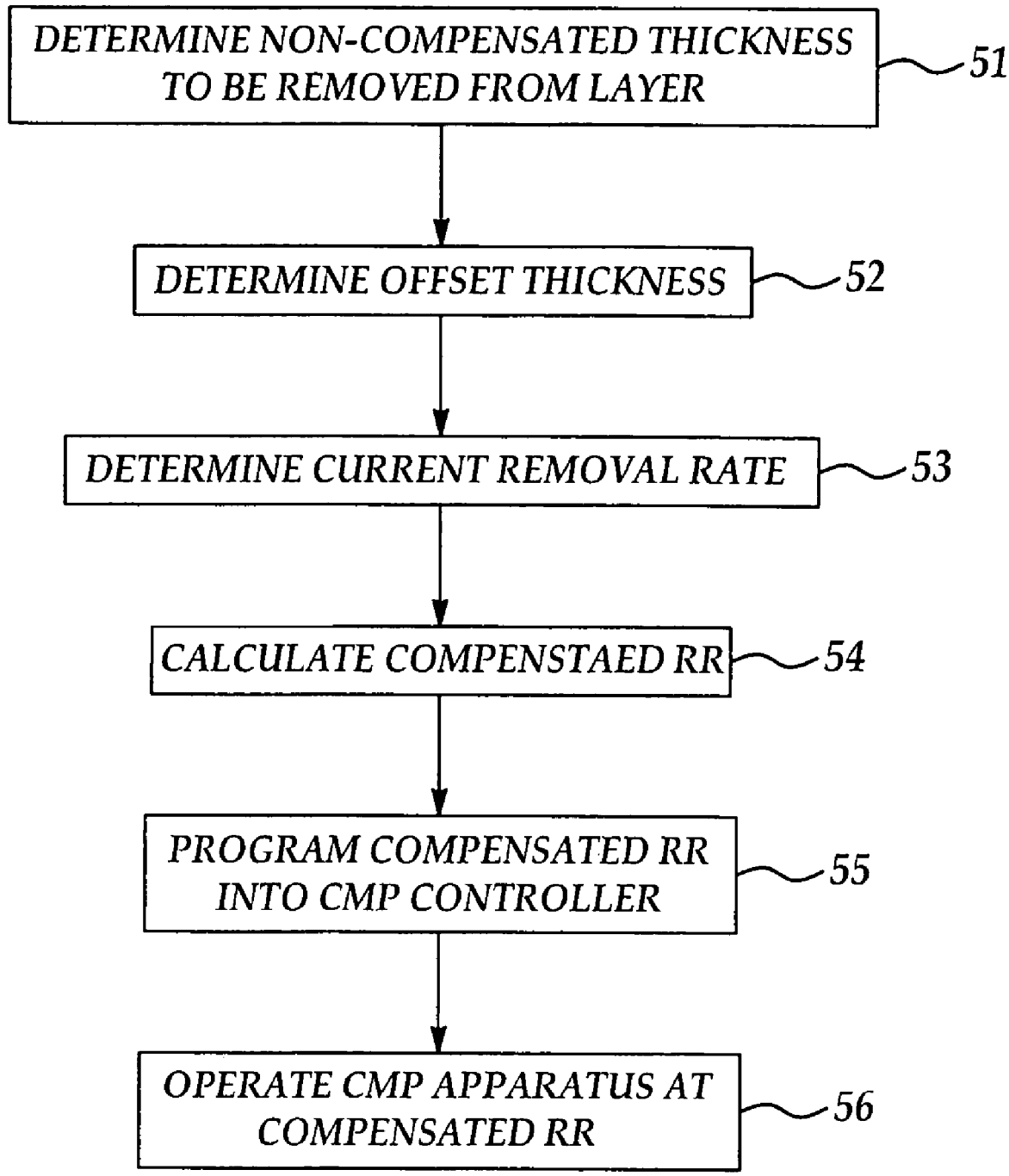
FIG. 3 is a flow diagram which summarizes a typical sequence of steps according to the method of the present invention.

Referring again to FIG. 2 and to FIG. 3, according to the method of the present invention the non-compensated thickness 24 of material to be removed from the material layer 14, based on the standard rather than the actual value for the total thickness of the wafer 10, is initially determined according to techniques known by those skilled in the art, as indicated in step Si of FIG. 3. Typically, the non-compensated thickness 24 and the standard value for the total thickness of the wafer 10 are determined using a sample or control wafer on which the material layer to be polished is deposited according to ideal processing conditions. This non-compensated thickness 24 is the value normally called for by the non-compensated CMP polishing recipe to be removed from the material layer 14 and would result in the prescribed wafer thickness 18 of the wafer 10 if the CMP operation were actually carried out according to that non-compensated polishing recipe, as heretofore noted. The non-compensated thickness 24 may range from typically about 500 angstroms or lower to about 12,000 angstroms, although this range may be broader depending on the application. Next, the offset thickness 22 is determined by subtracting the target wafer thickness 20 from the prescribed wafer thickness 18, as indicated in step S2 of FIG. 3. The offset thickness 22 may range from 1 angstrom to over 1,000 angstroms, depending on the application. Then, as indicated in step S3 of FIG. 3, the current removal rate of the CMP apparatus for the material layer 14 is determined typically using a sample wafer (not shown) having thereon a material layer the composition of which is identical to that of the material layer 14 on the wafer 10. The current removal rate may vary from typically about 1,000 angstroms/minute to about 5,000 angstroms/minute or higher, depending on the material of the material layer 14.

After the non-compensated thickness 24, the offset thickness 22 and the current removal rate of the CMP apparatus for the material layer 14 have been determined as heretofore described, these values are substituted, as indicated by process step S4 in FIG. 3, as variables into formula (I) below to obtain the compensated RR (removal rate):

Compensated RR=(non-compensated thickness/standard thickness+offset thickness)*current removal rate    Formula (I)

The compensated removal rate is used by the CMP apparatus as the compensated polishing recipe to polish the material layer 14 down to the target wafer thickness 20. Accordingly, as indicated in step S5, the compensated RR as calculated by the preceding formula is programmed into the controller of the CMP apparatus, which operates the CMP apparatus according to the compensated polishing recipe to remove the material layer 14 until the wafer 10 has the target wafer thickness 20, as indicated in step S6.

The method of the invention will be better understood by consideration of the following example.

EXAMPLE

A lot of wafers was subjected to chemical vapor deposition (CVD) to deposit an intermetal dielectric (IMD) layer thereon. The non-compensated thickness of IMD material to be removed from each wafer in the lot was 9,000 angstroms. The offset thickness, or difference between the target material layer thickness and the prescribed material layer thickness, was 200 angstroms. The current removal rate of the CMP apparatus was 3,000 angstroms/min. These values were substituted into the formula (1) above to obtain a compensated removal rate of 2934.8. This compensated removal rate value was programmed into the controller of the CMP apparatus, which polished the IMD layer according to the programmed compensated removal rate to obtain an IMD layer having the target layer thickness.

While the preferred embodiments of the invention have been described above, it will be recognized and understood that various modifications can be made in the invention and the appended claims are intended to cover all such modifications which may fall within the spirit and scope of the invention.

What is claimed is:

1. A method of polishing a material layer on a wafer, comprising the steps of:
   determining a non-compensated thickness to be removed from the layer;
   determining an offset thickness;
   determining a current removal rate;
   calculating a compensated removal rate using said non-compensated thickness, said offset thickness and said current removal rate; and
   polishing the layer according to said compensated removal rate.

2. The method of claim 1 wherein said calculating a compensated removal rate comprises the step of calculating said compensated removal rate according to the following Formula:

Compensated removal rate=(non-compensated thickness/non-compensated thickness+offset thickness)*current removal rate.

3. The method of claim 1 wherein said determining an offset thickness comprises the steps of determining a prescribed material layer thickness, determining a target material layer thickness and determining a difference between said prescribed material layer thickness and said target wafer thickness.

4. The method of claim 3 wherein said calculating a compensated removal rate comprises the step of calculating said compensated removal rate according to the following formula: Compensated removal rate=(non-compensated thickness/non-compensated thickness+offset thickness) *current removal rate.

5. The method of claim 1 wherein said determining a current removal rate comprises the step of providing a sample wafer, providing a sample layer on said sample wafer, and polishing said sample layer.

6. The method of claim 5 wherein said calculating a compensated removal rate comprises the step of calculating said compensated removal rate according to the following formula: Compensated removal rate=(non-compensated thickness/non-compensated thickness+offset thickness) *current removal rate.

7. The method of claim 5 wherein said determining an offset thickness comprises the steps of determining a prescribed material layer thickness, determining a target material layer thickness and determining a difference between said prescribed material layer thickness and said target material layer thickness.

8. The method of claim 7 wherein said calculating a compensated removal rate comprises the step of calculating said compensated removal rate according to the following formula: Compensated removal rate=(non-compensated thickness/non-compensated thickness+offset thickness) *current removal rate.

9. A method of polishing a material layer on a wafer, comprising the steps of:
   determining a non-compensated thickness to be removed from the layer according to said a standard total wafer thickness;
   determining an offset thickness:
   determining a current removal rate;
   calculating a compensated removal rate using said non-compensated thickness, said offset thickness and said current removal rate; and
   polishing the layer according to said compensated removal rate.

10. The method of claim 9 wherein said calculating a compensated removal rate comprises the step of calculating said compensated removal rate according to the following formula: Compensated removal rate=(non-compensated thickness/non-compensated thickness+offset thickness) *current removal rate.

11. The method of claim 9 wherein said determining an offset thickness comprises the steps of determining a prescribed material layer thickness, determining a target material layer thickness and determining a difference between said prescribed material layer thickness and said target material layer thickness.

12. The method of claim 11 wherein said calculating a compensated removal rate comprises the step of calculating said compensated removal rate according to the following formula: Compensated removal rate=(non-compensated thickness/non-compensated thickness+offset thickness) *current removal rate.

13. The method of claim 9 wherein said determining a current removal rate comprises the step of providing a sample wafer, providing a sample layer on said sample wafer, and polishing said sample layer.

14. The method of claim 13 wherein said calculating a compensated removal rate comprises the step of calculating said compensated removal rate according to the following formula: Compensated removal rate=(non-compensated thickness/non-compensated thickness+offset thickness) *current removal rate.

15. The method of claim 13 wherein said determining an offset thickness comprises the steps of determining a prescribed material layer thickness, determining a target material layer thickness and determining a difference between said prescribed material layer thickness and said target material layer thickness.

16. The method of claim 15 wherein said calculating a compensated removal rate comprises the step of calculating said compensated removal rate according to the following formula: Compensated removal rate=(non-compensated thickness/non-compensated thickness+offset thickness) *current removal rate.

17. A method of programming a CMP apparatus to polish a material layer on a wafer, comprising the steps of:
   determining a non-compensated thickness to be removed from the layer;
   determining an offset thickness;
   determining a current removal rate;
   calculating a compensated removal rate using said non-compensated thickness, said offset thickness and said current removal rate;
   programming said compensated removal rate into the CMP apparatus; and
   polishing the layer according to said compensated removal rate using the CMP apparatus.

18. The method of claim 17 wherein said calculating a compensated removal rate comprises the step of calculating said compensated removal rate according to the following formula: Compensated removal rate=(non-compensated thickness/non-compensated thickness+offset thickness) *current removal rate.

19. The method of claim 17 wherein said determining an offset thickness comprises the steps of determining a prescribed material layer thickness, determining a target material layer thickness and determining a difference between said prescribed material layer thickness and said target material layer thickness.

20. The method of claim 17 wherein said determining a current removal rate comprises the step of providing a sample wafer, providing a sample layer on said sample wafer, and polishing said sample layer.

* * * * *